(12) United States Patent
Craig et al.

(10) Patent No.: US 7,180,065 B2
(45) Date of Patent: Feb. 20, 2007

(54) INFRA-RED DETECTOR AND METHOD OF MAKING AND USING SAME

(75) Inventors: Richard A. Craig, Richland, WA (US); Jeffrey W. Griffin, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 150 days.

(21) Appl. No.: 10/957,091

(22) Filed: Sep. 30, 2004

(65) Prior Publication Data

US 2006/0065833 A1    Mar. 30, 2006

(51) Int. Cl.
*G01J 5/20* (2006.01)
*H01L 27/14* (2006.01)

(52) U.S. Cl. .................................. 250/338.4

(58) Field of Classification Search .............. 250/338.4
See application file for complete search history.

(56) References Cited

U.S. PATENT DOCUMENTS

| | | | |
|---|---|---|---|
| 5,012,098 A | | 4/1991 | Lindmayer |
| 5,804,827 A | * | 9/1998 | Akagawa et al. ...... 250/370.06 |
| 6,995,371 B2 | * | 2/2006 | Garber et al. ............... 250/330 |
| 2002/0167981 A1 | * | 11/2002 | Eisenbeiser ................. 372/43 |

* cited by examiner

*Primary Examiner*—David Porta
*Assistant Examiner*—Christopher G. Webb
(74) *Attorney, Agent, or Firm*—James D. Matheson (57) ABSTRACT

A low-cost infra-red detector is disclosed including a method of making and using the same. The detector employs a substrate, a filtering layer, a converting layer, and a diverter to be responsive to wavelengths up to about 1600 nm. The detector is useful for a variety of applications including spectroscopy, imaging, and defect detection.

96 Claims, 8 Drawing Sheets

INFRA-RED DETECTOR AND METHOD OF MAKING AND USING SAME

This invention was made with Government support under Contract DE-AC06-76RLO1830 awarded by the U.S. Department of Energy. The Government has certain rights in the invention.

FIELD OF THE INVENTION

The present invention relates to an infra-red detector and a method of making and using the same.

SUMMARY OF THE INVENTION

An infra-red detector is disclosed comprising a substrate responsive to electromagnetic radiation in a first wavelength region; a filtering layer operably disposed on the substrate transparent to electromagnetic radiation in the first wavelength region and attenuating to electromagnetic radiation shorter than those in the first region; a converting layer operably disposed on the filtering layer emitting electromagnetic radiation in the first wavelength region when wavelengths longer than those in the first wavelength region are incident thereon; and, a diverting means whereby radiation emitted from the converting layer is directed to the substrate generating an electronic signal therein proportional to the incident radiation for detection. The method of making the detector, in one embodiment, comprises: providing a substrate for detecting electromagnetic radiation in a first wavelength range; providing a filtering layer operably disposed on the substrate for converting and emitting electromagnetic radiation in the first wavelength region when wavelengths longer than those in the first region are incident thereon; providing a converting layer operably disposed on the filtering layer for filtering wavelengths shorter than those in the first region therefrom; and, providing a diverting means whereby emitted radiation is directed to the substrate whereby an electronic signal proportional to the incident radiation is generated in the detector and detected.

In an embodiment, the detector is a component of a spectrometer instrument.

In a further embodiment, the detector is a component of an event discrimination system or device.

In yet another embodiment, the detector is a component of an imaging system or device.

In yet another embodiment, the detector is a component of a defect detection system or device.

DETAILED DESCRIPTION

While the present invention is described herein with reference to the embodiments thereof, it should be understood that the invention is not limited thereto, and various alternatives in form and detail may be made therein without departing from the spirit and scope of the invention. All such modifications as would be envisioned by the person of ordinary skill in the art are hereby incorporated.

Figure 1A:
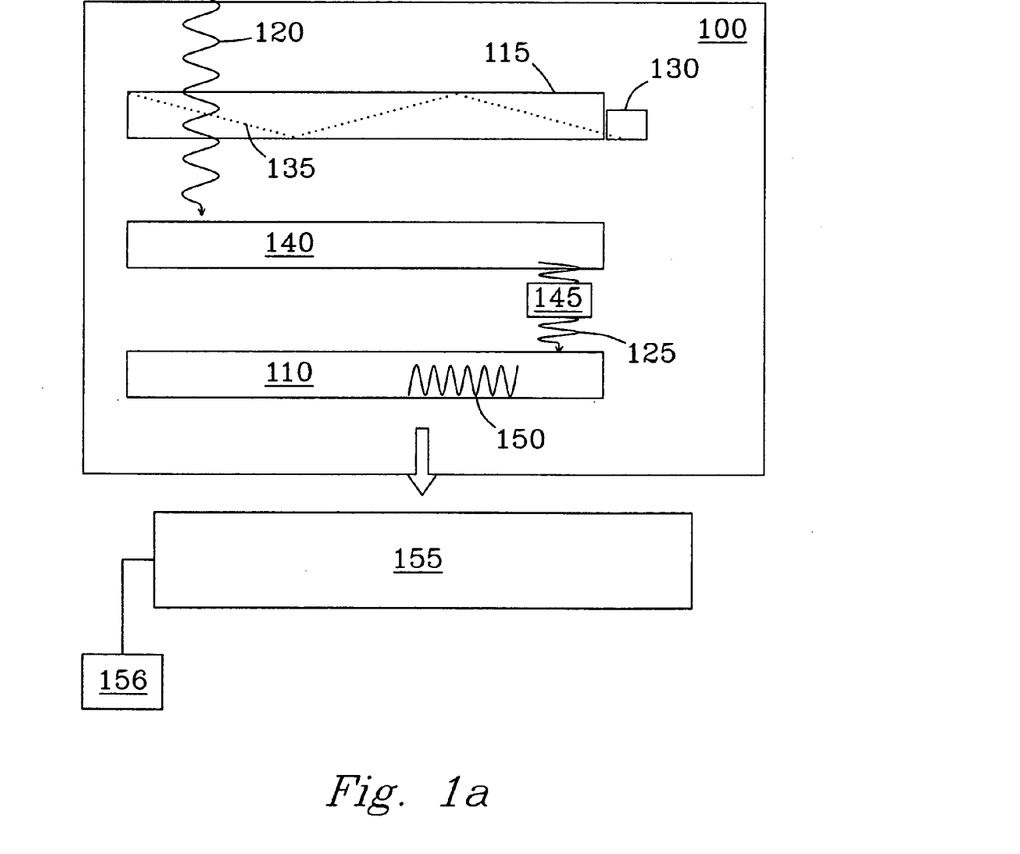
FIG. 1a illustrates an infra-red detector according to an embodiment of the invention.

FIG. 1a illustrates an infra-red (IR) detector 100 according to an embodiment of the invention. The detector 100 comprises a substrate 110 responsive to electromagnetic radiation having wavelengths 120 in a first wavelength range from about 400 nm to about 1100 nm, e.g., in the visible to near-infra-red spectrum. The substrate 110 comprises at least one semiconductor material, including but not limited to, silicon (Si), gallium arsenide (GaAs), germanium (Ge), or combinations thereof.

The detector 100 further comprises a filtering layer 140 disposed between substrate 110 and converting layer 115 for filtering wavelengths shorter than those in the first wavelength region, e.g., filtering UV radiation as background signal noise, and transmitting longer wavelengths. Materials within layer 140 provide attenuation of any excitation UV radiation while allowing longer wavelengths to reach the substrate 110 thereby providing a filtering capability. Materials suited for use within filtering layer 140 include, but are not limited to, metal oxides, $Ta_2O_5$, $SnO_2$, ZnO, and InSb. Other materials providing filtering capability may be chosen as would be selected by the person of ordinary skill in the art. Materials comprising the substrate 110 may be deposited via standard techniques known in the art, including, but not limited to, powder casting on a tape matrix, vapor sputtering, vapor deposition, and vacuum evaporation deposition. Alternately, filtering layer 140 may be optically linked to substrate 110. Thus, no limitation is intended by the disclosed materials or configurations described herein.

Thickness of layer 140 is dependent on the materials used and/or the properties desired. For example, ZnO provides about 95% attenuation for UV light up to about 340 nm at a thickness of about 30 nm, but is not limited thereto. In particular, thickness of layer 140 is in the range from about 10 nm to about 100 nm. More particularly, thickness is in the range from about 10 nm to about 50 nm. Most particularly, thickness is in the range from about 10 nm to about 30 nm.

The detector 100 further comprises a converting layer 115 operably disposed with filtering layer 140 for converting wavelengths of incident radiation 120 longer than those in the first wavelength region, e.g., upconverting wavelengths in the infra-red spectrum, to wavelengths in the first region, e.g., to visible spectrum wavelengths 125, and emitting the converted radiation, as detailed hereinbelow. Converting layer 115 comprises materials including, but not limited to, phosphors, cubic$Y_2O_3$:$Tb^{3+}$/$SiO_2$ inverse photonic lattice materials, rare-earth ion-doped solid state materials, mixed rare-earth oxides, electroluminescent polymers, photoluminescence materials, poly[2-methoxy,5-(2'-ethyl-hexyloxy)-p-phenylenevinylene] (MEH-PPV), poly(p-phenylenevinylene) (PPV), upconverting dyes, upconverting fluorophores, upconverting polymers, liquid crystal materials, two--r-conjugated organic materials, converting nanoparticles, converting gases, electrophoretic materials, converting uoropores, piezoelectric materials, electron trapping materials, SiGe, metal halide luminescent materials, photorefractive materials, $Tm^{3+}$ doped Ba—Y—Yb—F thin films, high-Z materials, solid-state materials, and combinations thereof. Thicknesses for converting layer 115 are selected based on desired properties. In particular, thickness of converting layer 115 is in the range from about 1 µm to about 100 µm. More particularly, thickness is in the range from about 1 µm to about 40 µm. Converting materials are disposed onto or operably connected to the substrate via standard techniques known in the art, including, but not limited to, powder casting on a tape matrix, vapor sputtering, vapor deposition, and vacuum evaporation deposition. Thus, no limitation is intended by the methods disclosed herein.

A light source 130 optically disposed with the converting layer 115 transmits light 135 through layer 115 populating trapping states therein with electrons near the conduction band, as described below. Sources include, but are not limited to, intermittent sources, pulsed sources, timed sources, and continuous sources as implemented in the art. Thus, no limitation is hereby intended by the embodiments and examples disclosed herein. In one example, the light source 130 is a blue light-emitting-diode (LED). In another example, light source 130 is a ultra-violet (UV) radiation source.

The detector 100 further comprises an electromagnetic energy diverting means 145 for directing radiation emitted from the converting layer to the substrate 110 generating an electronic signal (i.e., detector signal) 150 therein proportional to the incident radiation. Diverting means 145 include, but are not limited to, scintillating fibers, light pipes, wave guides, and combinations thereof. Detector signal 150 is detected by standard signal electronics 155 and/or components known in the art. Processing of signal 150 may further be done using signal processing components 156 or equipment, e.g., a CPU or computer, as will be selected by the person of ordinary skill in the art. No limitations are hereby intended.

Figure 1B:
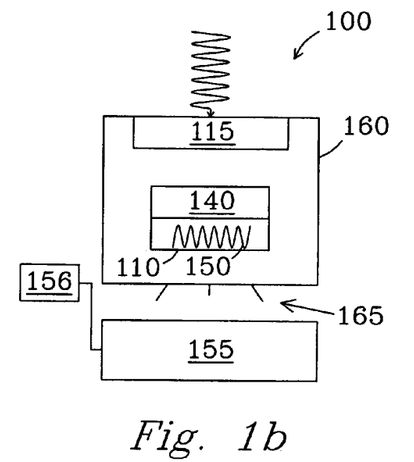
FIG. 1b illustrates an infra-red detector according to a further embodiment of the invention.

In a further embodiment of the invention illustrated in FIG. 1b, the detector 100 substrate 110 comprises silicon. The detector 100 further comprises a housing member 160, and circuit interconnects 165 operable for connecting detector 100 for use in devices and instruments, e.g., a spectrometer instrument, as described further hereinbelow.

Figure 1C:
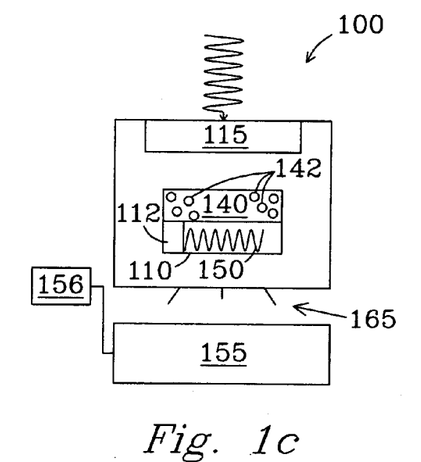
FIG. 1c illustrates an infra-red detector comprising a diode array according to yet another embodiment of the invention.

In yet another embodiment illustrated in FIG. 1c, substrate 110 comprises a two-dimensional array 112 selected from, e.g., diode arrays and linear arrays, further comprising any operable semiconductor material, e.g., silicon. In the instant embodiment, filtering layer 140 comprises a visible-light transparent, UV-attenuating material 142 as described herein, layer 140 being operably disposed between a two-dimensional array 112 and conversion layer 115, e.g., as a coating on substrate 110. Thickness of layers 115 and 140 is optimized for minimizing background signal noise and maximizing emission, collection, and detection of visible light by the two-dimensional array 112. Detector signal 150 is detected by standard signal electronics 155 and/or components known in the art. Processing of signal 150 is done using standard signal processing components or equipment 156, e.g., a CPU or computer, as will be selected by the person of ordinary skill in the art. No limitations are hereby intended.

Figure 1D:
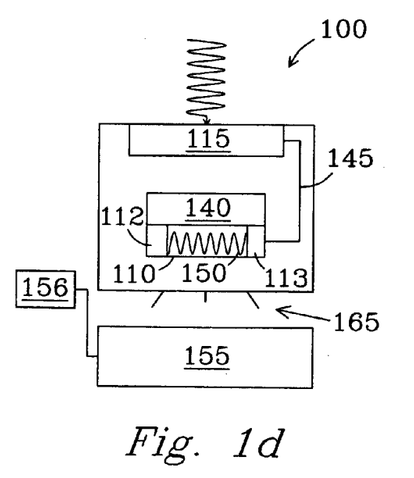
FIG. 1d illustrates an infra-red detector comprising a luminescent fiber according to yet another embodiment of the invention.

In yet another embodiment illustrated in FIG. 1d, the detector 100 is configured with a commercially available fiber 145 [e.g., CeramOptec GmbH, Bonn, GE] as a diverting means 145 optically linked to converting layer 115. Fiber 145 has an I.D. and O.D that couples and numerically-aperture-matches the thickness of conversion layer 115 such that emitted light is efficiently captured and effectively channeled to substrate 110 for detection. Fibers suited for diverting light to detector 100 are selected from the group consisting of optical fibers, step-index fibers, single-mode step index fibers, multimode step index fibers, and graded-index fibers. In one exemplary configuration, light from fiber 145 is collimated using a GRIN lens 113 at a pitch of 0.25, e.g., a separate fiber cut to a length of one quarter of the pitch of the fiber. Light exiting fiber 145 can be collimated into a parallel beam when the output end of the fiber is connected to the GRIN lens 113. Detector signal 150 is detected by standard signal electronics 155 and/or components known in the art. Processing of signal 150 may further be done using signal processing components 155 or equipment 156, e.g., a CPU or computer, as will be selected by the person of ordinary skill in the art. No limitations are hereby intended.

Figure 1E:
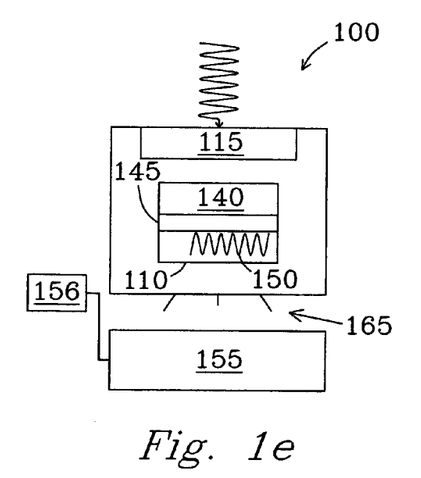
FIG. 1e illustrates an infra-red detector comprising a planar wave guide according to still yet another embodiment of the invention.

In yet another embodiment illustrated in FIG. 1e, detector 100 is configured with a waveguide 145 as a diverting means 145 optically linked to converting layer 115 for diverting UV light to converting layer 115. In one exemplary example, waveguide 145 is disposed between substrate 110 and filtering layer 140. Waveguide 145 is of a thickness of at least about one-quarter wavelength with a "cladding" thickness sufficiently thin permitting optical transmission of wavelengths to the substrate 110. Waveguides suitable for use include, but are not limited to, planar waveguides, rectangular waveguides, square waveguides, optical waveguides, and/or combinations thereof. Waveguides may be used in combination with suitable optics for directing and/or converging incident radiation in and through the waveguide to the substrate, including, but not limited to, e.g., gratings, prisms, mirrors, and/or lenses. All configurations and/or component combinations as would be envisioned or implemented by the person of ordinary skill in the art are incorporated herein. Detector signal 150 is detected by standard signal electronics 155 and/or components known in the art. Processing of signal 150 is done using signal processing components or equipment 156, e.g., a CPU or computer, as will be selected by the person of ordinary skill in the art. No limitations are hereby intended. Operation of the filtering layer 140 and transmission of incident radiation through the layer will now be further described by reference to FIG. 2.

Figure 2:
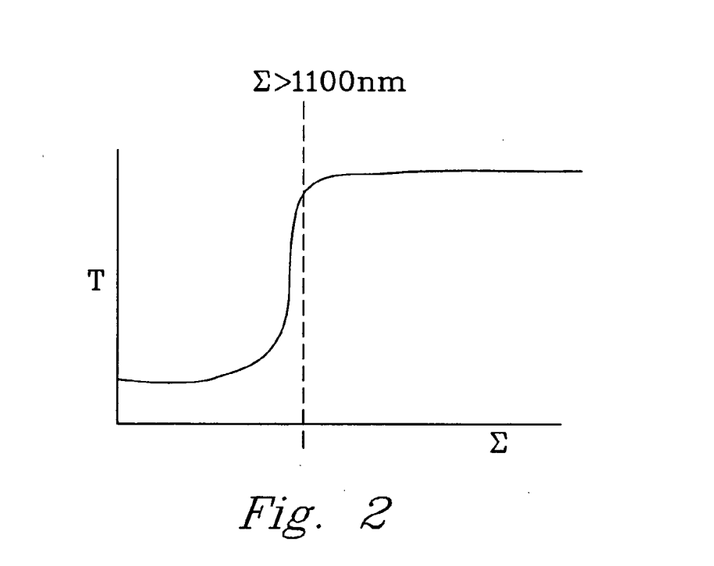
FIG. 2 illustrates a signal response for a filtering layer of the detector exhibiting a cutoff of about 400 nm, according to an embodiment of the invention.

FIG. 2 illustrates a typical filtering response of filtering layer 140 showing expected transmittance (T) as a function of wavelength, wherein transmittance plus reflectance plus absorbance equals a value of unity (i.e., 1), and wherein absorbance equals emittance. In the figure, incident radiation below a wavelength of about 1100 nm is attenuated or filtered, while wavelengths above about 1100 nm, e.g., infra-red wavelengths, are transmitted through the layer.

Layer 140 prevents UV excitation wavelengths causing signal noise from being detected in the substrate 110. In particular, layer 140 has a long-pass cutoff less than or equal to about 400 nm depending on the incident UV excitation wavelengths thereby permitting only desired visible wavelengths emitted from conversion layer 115 to be detected in substrate 110. The response is Illustrative of long-band-pass filtering materials suitable for use in detector 100. Thus, any filtering material passing or transmitting visible wavelengths to the substrate 110 is suitable for use in the present invention. In particular, materials having various cutoff wavelengths may be selected whereby layer 140 exhibits long-band-pass filtering properties for wavelengths in the range from about 300 nm to about 400 nm. More particularly, cutoffs may be selected at wavelengths in the range from about 350 nm to about 400 nm. Thus, no limitation is hereby intended. Wavelength conversion will now be described in more detail with reference to FIG. 3.

Figure 3:
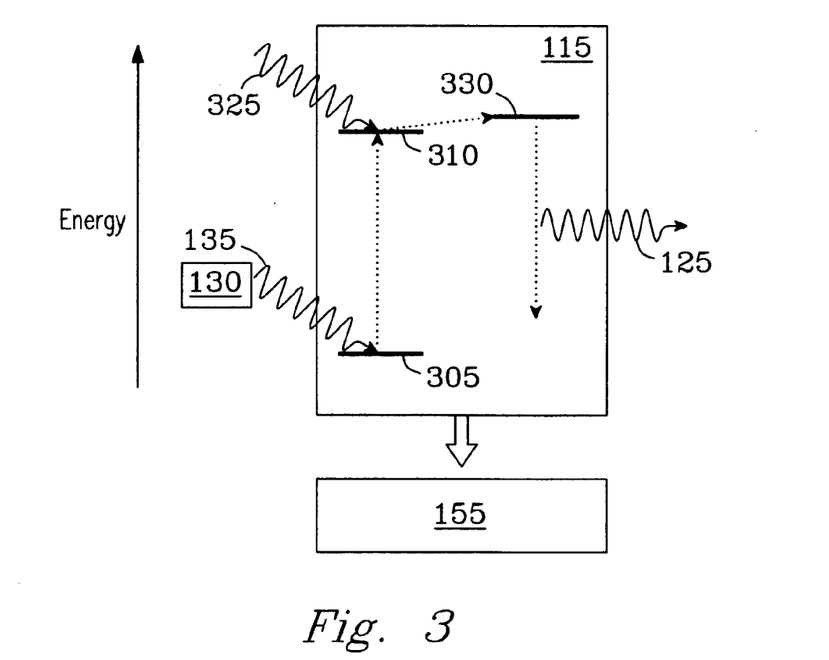
FIG. 3 illustrates a frequency conversion system for populating trapping states within a converting layer of an infra-red detector according to one embodiment of the invention.

FIG. 3 illustrates but one of a plurality of wavelength or frequency conversion mechanisms operable within a converting layer 115. Electrons populating ground energy states 305 within the layer 115 are promoted to a plurality of trapping states 310 close to the conduction band 330. Need for UV filtering is demonstrated in cases where promotion of electrons occurs in multiple-stages, e.g., in two stages, whereby a first stage transitions electrons to the conduction band via UV radiation excitation, followed by natural decay of electrons in a second stage to fill the trapping states. Natural or induced defects in converting layer 115 at the molecular level form the trapping states 310. Electrons are promoted to the trapping states 310 in the converting layer 115 by exposing the layer to a radiation source 130, e.g., an LED or UV source, emitting electromagnetic radiation 135 having wavelengths less than or equal to about 400 nm such that trapping states 310 are optimally filled with electrons. When IR radiation 325 having wavelengths of from about 1100 nm is incident on the converting layer 115, electrons in trapping states 310 are promoted to conduction band 330 (radiative state) with a corresponding change in frequency (i.e., upconversion) resulting in emission of photons whose decay emits wavelengths 125 in the visible spectrum. Visible light emitted through photon decay is detected being proportional to the incident IR radiation 325. Spectral response of detector 100 will now be described with reference to FIGS. 4a–4b.

Figure 4A:
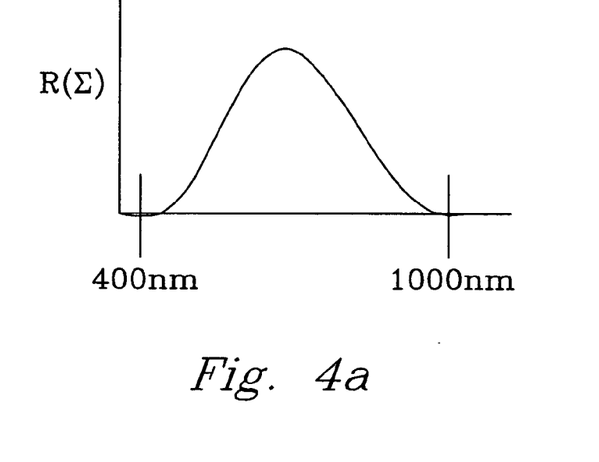
FIG. 4a illustrates a wavelength response for a substrate of an infra-red detector according to an embodiment of the invention.
Figure 4B:
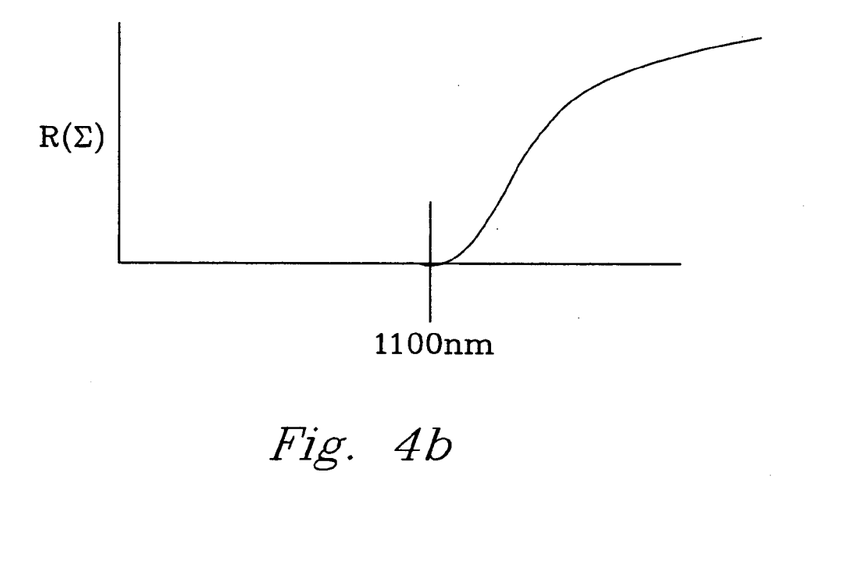
FIG. 4b illustrates a signal response added to an infra-red detector according to a further embodiment of the invention.

FIG. 4a illustrates a typical unmodified wavelength response for layer 110 before incorporation in detector 100 of the present invention, having a wavelength response in the range from about 400 nm, with a signal cutoff of about 1000 nm. FIG. 4b illustrates the expected signal response added to the operable detector of the present invention, showing a rise in detector response beyond the cutoff in FIG. 4a. In the instant example, the detector is responsive and operable in the range from about 400 nm to about 1600 nm using readily available materials.

Figure 5:
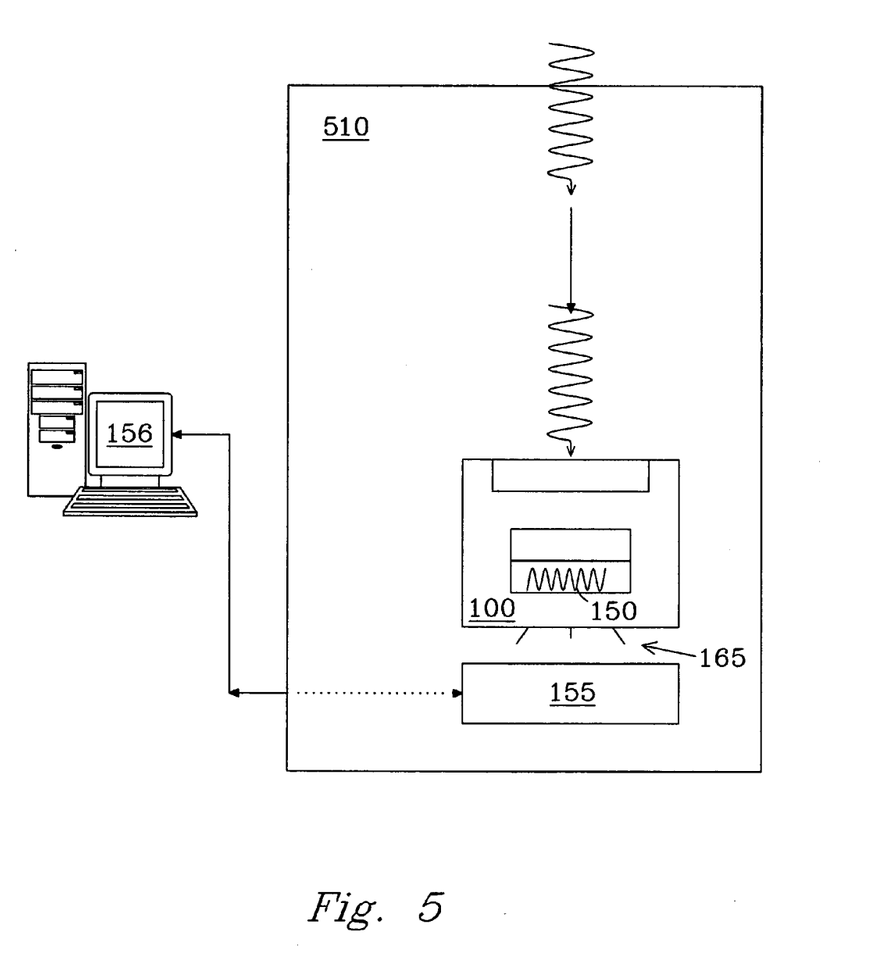
FIG. 5 illustrates a spectrometer instrument incorporating an infra-red detector of the invention.

FIG. 5 illustrates a spectrometer instrument 510 incorporating a IR detector 100 according to one embodiment of the method of use of the invention. Instruments suited for use with detector 100 are selected from the group consisting of Fourier Transform spectroscopy instruments, Static Fourier Transform spectroscopy instruments, event discrimination or time-domain instruments (e.g., gunshot identification instrumentation), imaging instruments (e.g., imaging CCD instruments), phase measurement instruments (e.g., holographic inspection instruments and conventional FT spectrometers), including components thereof. No limitation in classes of instruments is intended by the disclosure herein.

Detector 100 is operably connected in instrument 510 via circuit interconnects 165 standard in the art. Detector signal 150 is detected by standard signal electronics and/or components 155 known in the art. Processing of signal 150 may further be done using signal processing equipment 156 and/or components as will be selected by the person of ordinary skill in the art. For example, instrument 510 and signal electronics 155 may be interfaced to, or operated in conjunction with, e.g., a computer 156 or other operating and/or processing equipment implemented by the person of ordinary skill. No limitations are hereby intended by the disclosure herein.

Figure 6:
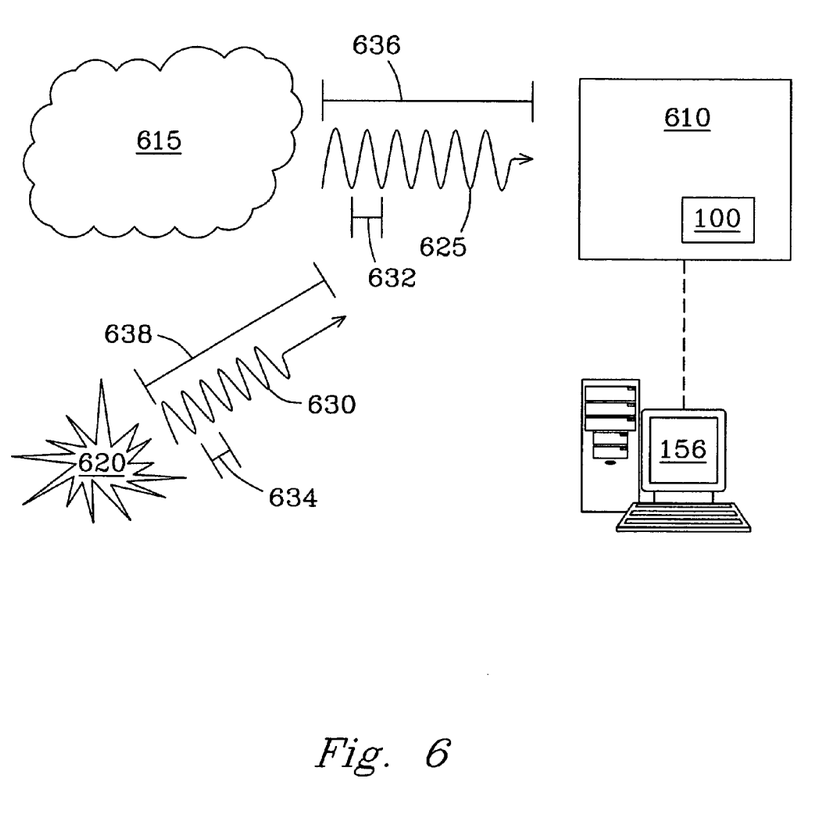
FIG. 6 illustrates a system for discriminating events according to an embodiment of the method of use of the invention.

In one embodiment according to the method of use, illustrated in FIG. 6, detector 100 is a component of an event discrimination system or device 610. For example, differences in time domain behavior of infrared (IR) radiation emitted from, e.g., a gunshot event 615 and/or a glint (e.g., flash of light) event 620 are illustrative. IR radiation 625 and 630 emitted from the separate events reaches the detector 100 whereby characteristics of the radiation including, but not limited to, e.g., wavelength, e.g., 632 and 634, and distance, e.g., 636 and 638, permit event 615 to be discriminated and characterized from event 620. Differences quantified using collected data permits the characterization and/or discrimination of events. Data for discriminating and/or characterizing events include, but are not limited to, e.g., wavelength ($\lambda$), timing, emissivity ($\epsilon$), frequency (f), time-of-flight (t), transmittance (T), angles of incidence ($\theta$), phasing, reflectance, index of refraction (n), and intensity. Analysis of data may be done in conjunction with a computer and/or other data processing system 156.

Figure 7:
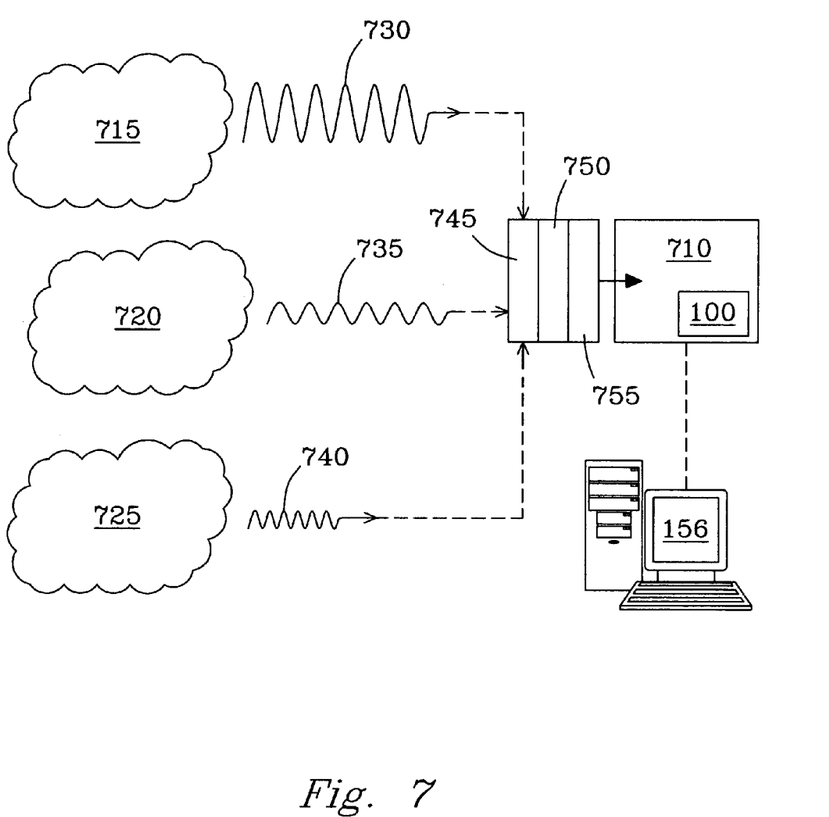
FIG. 7 illustrates a system for imaging according to a further embodiment of the method of use of the invention.

In yet another embodiment illustrated in FIG. 7, detector 100 is a component of an imaging system or device 710. In but one illustrative example, gas clouds 715, 720, and 725 are illustrated representative of a plurality of possible gaseous sources, including, but not limited to, e.g., gas plumes, main ruptures, manufacturing breaches, storage tank releases, transport accidents, production upsets, and/or emission events. Clouds 715, 720, and 725 emit wavelengths 730, 735, and 740, respectively, characteristic of the material in the cloud and/or characteristic of the given event which is measured and analyzed. In particular, detector 100 of system 710 detects incident radiation generating signals representative of the intact gas cloud(s), streams, or event(s) whereby images and/or event data may be compiled and analyzed. In the system illustrated, the detector is used in conjunction with various filters, e.g., 745, 750, and 755, and/or other system components for discriminating and/or characterizing the radiation events, including, but not limited to, long-band-pass filters, optical filters, polarizers, lenses, sensors, and the like, including combinations thereof, as would be implemented by the person of ordinary skill in the art. Thus, no limitation is hereby intended. Image analyses comprises measurement of event characteristics including, but not limited to, wavelength determination, time-of-flight, intensity, interference patterns, holographic patterns, phase measurement patterns, polarization patterns, wavelength patterns, time scales, and combinations thereof, e.g., polarization intensity. Signal processing and/or instrument control may be performed in conjunction with a computer or other processing system 156.

Figure 8:
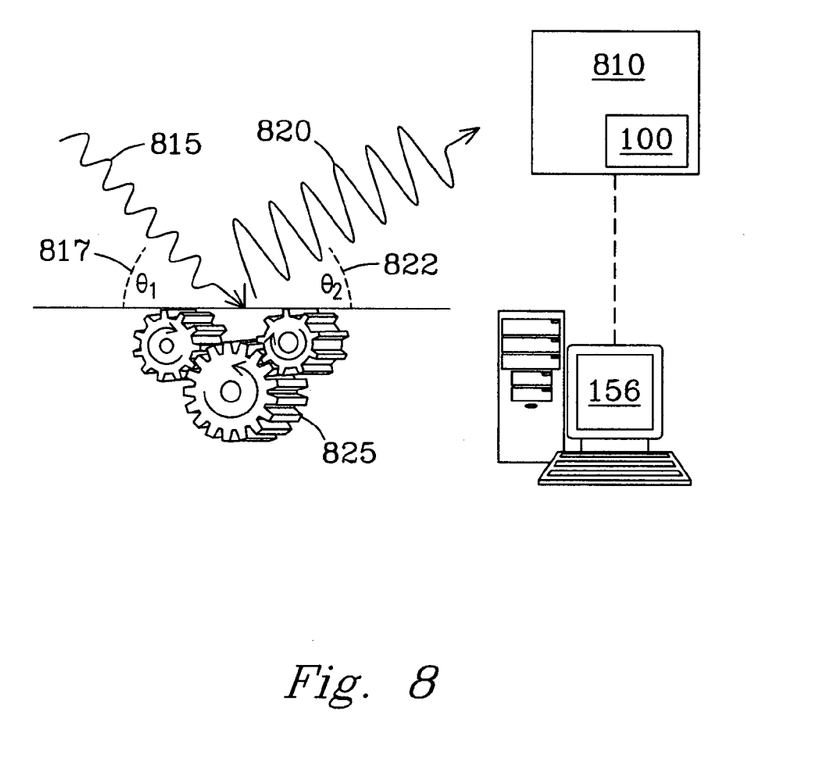
FIG. 8 illustrates a system for detecting defects according to yet a further embodiment of the method of use of the invention.

In yet another embodiment illustrated in FIG. 8 according the method of use, detector 100 is a component of a defect detection system or device 810 for detecting defects including, but not limited to, manufacturing defects. In but one example, manufactured items, e.g., a sprocket 825, is interrogated using a first radiation wavelength 815 which impinges the sprocket at a characteristic first angle ($\theta_1$) 817 with respect to the surface horizontal. Reflected wavelength 820 is measured with respect to the surface horizontal at a second angle ($\theta_2$) 822 and detected using system 810. Interrogation may be performed in conjunction with, e.g., rotation of the item, to identify all manufacturing or other defects on all surfaces. Differences in collected data are compared against identical control items and data. Tolerances and standards as utilized and/or known in the art would identify defective items. Signal processing may be done in conjunction with signal processing equipment 156, e.g., a computer, as will be known in the art.

While the present invention has been described herein with reference to various embodiments thereof, it should be understood that the invention is not limited thereto, and various alternatives in form and detail may be made therein without departing from the spirit and scope of the invention. In particular, those skilled in the art will appreciate that.

We claim:

1. An infra-red detector for measuring incident radiation, comprising:
    a substrate responsive to electromagnetic radiation in a first wavelength region;
    a filtering layer operably disposed on said substrate, said filtering layer passing electromagnetic radiation in said first wavelength region and attenuating electromagnetic radiation having a wavelength shorter than said first wavelength region;
    a converting layer operably disposed on said filtering layer, said converting layer converting a plurality of wavelengths of electromagnetic radiation longer than in said first wavelength region to a plurality of converted wavelengths in said first wavelength region and emitting said plurality of converted wavelengths; and,
    a diverting means whereby said plurality of converted wavelengths emitted from said converting layer are directed to said substrate to generate an electronic signal proportional to said plurality of converted wavelengths in said substrate for detection.

2. The detector of claim 1, wherein said substrate comprises a semiconductor.

3. The detector of claim 2, wherein said semiconductor is selected from the group consisting of Si, GaAs, Ge, and combinations thereof.

4. The detector of claim 2, wherein said semiconductor comprises Si.

5. The detector of claim 2, wherein said semiconductor comprises GaAs.

6. The detector of claim 2, wherein said semiconductor comprises Ge.

7. The detector of claim 2, wherein said substrate comprises a silicon diode.

8. The detector of claim 2, wherein said substrate comprises a diode array.

9. The detector of claim 8, wherein said diode array is a two-dimensional diode array.

10. The detector of claim 2, wherein said substrate comprises a linear array.

11. The detector of claim 2, wherein said substrate comprises a charge-coupled device.

12. The detector of claim 1, wherein said detector has a spectral response to radiation of wavelengths in the range from about 400 nm to about 1600 nm.

13. The detector of claim 1, wherein said detector further comprises a radiation source for filling a plurality of trapping states within said converting layer with excitable electrons.

14. The detector of claim 13, wherein said radiation source is a blue light emitting diode.

15. The detector of claim 14, wherein said ultra-violet radiation source is an intermittent radiation source.

16. The detector of claim 13, wherein said radiation source is a ultra-violet radiation source.

17. The detector of claim 16, wherein said ultra-violet radiation source is a continuous radiation source.

18. The detector of claim 13, wherein said electrons are excited by incident electromagnetic radiation in the range up to about 400 nm.

19. The detector of claim 1, wherein said diverting means comprises a member selected from the group consisting of luminescent fibers, light pipes, waveguides, and combinations thereof.

20. The detector of claim 19, wherein said luminescent fibers are selected from the group consisting of optical, step-index, multimode-step-index, graded-index, and combinations thereof.

21. The detector of claim 19, wherein said waveguides are selected from the group consisting of planar, rectangular, square, optical, and combinations thereof.

22. The detector of claim 1, wherein said detector detects images selected from the group consisting of interference patterns, holographic patterns, and combinations thereof.

23. The detector of claim 22, wherein said detector detects one-dimensional pattern images.

24. The detector of claim 22, wherein said detector detects two-dimensional pattern images.

25. The detector of claim 1, wherein said detector measures intensity.

26. The detector of claim 25, wherein said intensity is polarization intensity.

27. The detector of claim 1, wherein said detector is configured for use in a holographic phase measurement system or device.

28. The detector of claim 1, wherein said filtering layer comprises a material selected from the group consisting of $Ta_2O_5$, $SnO_2$, ZnO, and InSb.

29. The detector of claim 1, wherein said converting layer comprises a converting material.

30. The detector of claim 29, wherein said converting material comprises at least one member selected from the group consisting of phosphors, cubi $Y_2O_3$:$Tb^{3+}$/$SiO_2$ inverse photonic lattice materials, rare-earth ion-doped solid state materials, mixed rare-earth oxides, electroluminescent polymers, photoluminescent materials, poly[2-methoxy,5-(2'-ethyl-hexyloxy)-p-phenylenevinylene], poly(p-phenylenevinylene), upconverting dyes, upconverting fluorophores, upconverting polymers, liquid crystal materials, two $\pi$-conjugated organic materials, upconverting nanoparticles, upconverting gases, electrophoretic materials, upconverting uoropores, piezoelectric materials, electron trapping materials, SiGe, metal halide luminescent materials, photorefractive materials, $Tm^{3+}$ doped Ba—Y—Yb—F thin films, high-Z materials, solid-state materials, and combinations thereof.

31. The detector of claim 29, wherein said converting layer comprises an electron-trapping material.

32. The detector of claim 29, wherein said converting layer comprises a phosphor.

33. The detector of claim 1, wherein said converting layer has a thickness in the range from about 1 μm to about 100 μm.

34. The detector of claim 1, wherein said converting layer has a thickness in the range from about 1 μm to about 40 μm.

35. The detector of claim 1, wherein said filtering layer has a thickness in the range from about 10 nm to about 100 nm.

36. The detector of claim 1, wherein said filtering layer has a thickness in the range from about 10 nm to about 50 nm.

37. The detector of claim 1, wherein said filtering layer has a thickness in the range from about 10 nm to about 30 nm.

38. The detector of claim 1, wherein said detector is a component of a Fourier Transform Spectrometer instrument.

39. The detector of claim 38, wherein said instrument is a Static Fourier Transform Spectrometer instrument.

40. The detector of claim 1, wherein said detector is a component of an imaging analysis system or device.

41. The detector of claim 1, wherein said detector is a component of a phase measurement device.

42. The detector of claim 1, wherein said detector is a component of an infrared imaging system or device.

43. The detector of claim 1, wherein said detector is a component of an event discrimination device.

44. The detector of claim 1, wherein said detector is a component of a holographic imaging system or device.

45. The detector of claim 44, wherein said holographic imaging system comprises phase measurement analysis.

46. The detector of claim 1, wherein said detector is a component of a defect detection system or device.

47. The detector of claim 1, wherein said detector is used for detection of manufacturing defects.

48. A method for making an infra-red radiation detector, comprising:
providing at least one substrate responsive to detecting electromagnetic radiation in a first wavelength region;
providing a filtering layer operably disposed on said substrate, said filtering layer passing electromagnetic radiation in said first wavelength region and attenuating electromagnetic radiation having a wavelength shorter than said first wavelength region;
providing a converting layer operably disposed on said filtering layer, said converting layer converting a plurality of wavelengths of electromagnetic radiation longer than in said first wavelength region to a converted plurality of wavelengths in said first wavelength region and emitting said converted plurality of wavelengths; and,
providing a diverting means optically linked to said converting layer for directing said converted plurality of wavelengths to said substrate whereby an electronic signal proportional to said converted plurality of wavelengths is generated in said substrate and detected.

49. The method of claim 48, wherein said at least one substrate comprises a semiconductor.

50. The method of claim 49, wherein said semiconductor is a member selected from the group consisting of Si, GaAs, Ge, and combinations thereof.

51. The method of claim 49, wherein said semiconductor comprises Si.

52. The method of claim 49, wherein said semiconductor comprises GaAs.

53. The method of claim 49, wherein said semiconductor comprises Ge.

54. The method of claim 48, wherein said substrate comprises a diode or diode array comprising silicon.

55. The method of claim 54, wherein said substrate comprises a two-dimensional diode array.

56. The method of claim 54, wherein said array comprises a charge-coupled device.

57. The method of claim 48, wherein said detector has a spectral response to radiation of wavelengths in the range from about 400 nm to about 1600 nm.

58. The method of claim 48, wherein said detector comprises a radiation source operable for filling a plurality of trapping states within said converting layer with excitable electrons.

59. The method of claim 58, wherein said source is a ultra-violet radiation source.

60. The method of claim 59, wherein said UV source is a continuous source.

61. The method of claim 59, wherein said UV source is an intermittent source.

62. The method of claim 58, wherein said source is a blue light emitting diode.

63. The detector of claim 58, wherein said trapping states are filled using electromagnetic radiation in the range less than or equal to about 400 nm.

64. The method of claim 48, wherein said diverting means are selected from the group consisting of luminescent fibers, light pipes, waveguides, and combinations thereof.

65. The method of claim 64, wherein said diverting means is a luminescent fiber.

66. The method of claim 65 wherein said fiber is selected from the group consisting of optical fibers, step-index fibers, multimode-step-index fibers, graded-index fibers, or combinations thereof.

67. The method of claim 64, wherein said waveguides are selected from the group consisting of planar, rectangular, square, optical, or combinations thereof.

68. The method of claim 48, wherein said detector measures images selected from the group consisting of interference patterns, holographic patterns, and combinations thereof.

69. The method of claim 68, wherein said detector measures one-dimensional pattern images.

70. The method of claim 69, wherein said detector measures two-dimensional pattern images.

71. The method of claim 48, wherein said detector measures intensity.

72. The method of claim 71, wherein said intensity is polarization intensity.

73. The method of claim 48, wherein said detector is a component of a holographic phase measurement device.

74. The method of claim 48, wherein said filtering layer comprises a material selected from the group consisting of $Ta_2O_5$, $SnO_2$, ZnO, and InSb.

75. The method of claim 48, wherein said filtering layer has a thickness in the range from about 10 nm to about 100 nm.

76. The method of claim 48, wherein said filtering layer has a thickness in the range from about 10 nm to about 50 nm.

77. The method of claim 48, wherein said filtering layer has a thickness in the range from about 10 nm to about 30 nm.

78. The method of claim 48, wherein said converting layer comprises an upconverting material.

79. The method of claim 78, wherein said upconverting material comprises at least one member selected from the group consisting of phosphors, cubic $Y_2O_3$:$Tb^{3+}$/$SiO_2$ inverse photonic lattice materials, rare-earth ion-doped solid state materials, mixed rare-earth oxides, electroluminescent polymers, photoluminescence materials, poly[2-methoxy,5-(2'-ethyl-hexyloxy)-p-phenylenevinylene], poly(p-phenylenevinylene), upconverting dyes, upconverting fluorophores, upconverting polymers, liquid crystal materials, two π-conjugated organic materials, upconverting nanoparticles, upconverting gases, electrophoretic materials, upconverting uoropores, piezoelectric materials, electron trapping materials, SiGe, metal halide luminescent materials, photorefractive materials, $Tm^{3+}$ doped Ba—Y—Yb—F thin films, high-Z materials, solid-state materials, and combinations thereof.

80. The method of claim 78, wherein said upconverting material layer requires no charging.

81. The method of claim 78, wherein said upconverting material is a thermal upconverting material.

82. The method of claim 78, wherein said upconverting material comprises an electron-trapping material.

83. The method of claim 78, wherein said upconverting material comprises a phosphor.

84. The method of claim 48, further comprising a light source operably connected to said converting layer for filling a plurality of trapping states in said converting layer.

85. The method of claim 84, wherein said light source is a blue light emitting diode.

86. The method of claim 84, wherein said light source is a UV source.

87. The method of claim 48, wherein said converting layer has a thickness in the range from about 1 µm to about 100 µm.

88. The method of claim 48, wherein said converting layer has a thickness in the range from about 1 µm to about 40 µm.

89. The method of claim 48, wherein said detector is a component of a Fourier Transform Spectrometer instrument.

90. The method of claim 89, wherein said instrument is a Static Fourier Transform Spectrometer instrument.

91. The method of claim 48, wherein said detector is a component of a phase measurement system or device.

92. The method of claim 48, wherein said detector is a component of an imaging system or device.

93. The method of claim 48, wherein said imaging system is a holographic imaging system.

94. The method of claim 48, wherein said detector is a component of an event discrimination system or device.

95. The method of claim 48, wherein said detector is a component of a defect detection system or device.

96. The method of claim 48, wherein said detector is a component of a phase measurement system or device.

* * * * *